(12) United States Patent
Nitta

(10) Patent No.: US 7,085,545 B2
(45) Date of Patent: Aug. 1, 2006

(54) TRANSMISSION POWER CONTROL CIRCUIT

(75) Inventor: Hitoshi Nitta, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 685 days.

(21) Appl. No.: 09/985,557

(22) Filed: Nov. 5, 2001

(65) Prior Publication Data

US 2002/0058485 A1    May 16, 2002

(30) Foreign Application Priority Data

Nov. 14, 2000   (JP)   .............................. 2000-346402

(51) Int. Cl.
*H01Q 11/12*   (2006.01)
*H04B 1/04*   (2006.01)

(52) U.S. Cl. .................................... 455/126; 455/127.2

(58) Field of Classification Search ................ 455/126, 455/127.1, 127.2, 127.3, 115.1, 114.2
See application file for complete search history.

(56) References Cited

U.S. PATENT DOCUMENTS

| | | | | |
|---|---|---|---|---|
| 4,092,617 A | * | 5/1978 | Fletcher et al. | ............ 333/17.1 |
| 4,709,403 A | * | 11/1987 | Kikuchi | ....................... 455/126 |
| 5,325,064 A | * | 6/1994 | Leanes et al. | ............... 324/638 |
| 5,884,149 A | * | 3/1999 | Jaakola | ........................ 455/103 |

FOREIGN PATENT DOCUMENTS

| | | |
|---|---|---|
| JP | 1-212925 | 8/1989 |
| JP | 1-293017 | 11/1989 |
| JP | 2-172309 | 7/1990 |
| JP | 9-214362 | 8/1997 |
| JP | 9-326655 | 12/1997 |
| JP | 10-22844 | 1/1998 |
| JP | 2000-286655 | 10/2000 |
| JP | 2003289254 A * | 10/2003 |

* cited by examiner

*Primary Examiner*—Nguyen T. Vo
(74) *Attorney, Agent, or Firm*—Nixon & Vanderhye P.C.

(57) ABSTRACT

The level of an input high-frequency signal is adjusted by a transmission-level adjusting portion, and two signals are created and distributed by a distribution portion. One of the two signals is output, while the other one thereof is applied to a frequency-deviation adjusting portion to cancel the frequency property of a detection portion and thereafter is applied to the detection portion, where the signal is detected to be a DC voltage. A comparator compares the DC voltage with a reference voltage output from a reference voltage generating portion, and the output of the comparison is used to control a gain of the transmission-level adjusting portion.

6 Claims, 10 Drawing Sheets

TRANSMISSION POWER CONTROL CIRCUIT

BACKGROUND OF THE INVENTION

1. Field of the Invention

The present invention relates to a transmission power control circuit, and more particularly, to a transmission power control circuit that is used in a two-way radio communication device and that can maintain transmission power constant while performing transmission.

2. Description of the Background Art

Currently, as the Internet has vastly developed, two-way radio communication devices that take on the infrastructure of the Internet have become widely used. Major examples thereof are portable telephones, two-way satellite communication, and ground microwave communication. However, transmission power in such two-way radio communication devices must be strictly controlled in order to respond to a request from a receiving end, i.e. a base station or a satellite, and to reduce unwanted emission of spurious and noise. For that purpose, a transmission power control circuit maintaining the transmission power constant is generally integrated in a transmission portion of a two-way radio communication device.

FIGS. 8 and 9 are block diagrams showing a conventional transmission power control circuit. In FIG. 8, a high-frequency signal is input into a transmission-level adjusting portion 1, where the signal is adjusted in its level, and is further input into a distribution portion 2. Distribution portion 2 creates two signals from the input high-frequency signal for distribution, one of which is output as a transmission signal, and the other one of which is applied to a detection portion 3.

At detection portion 3, as shown in FIG. 9, the input high-frequency signal is detected and rectified by a diode 6, a capacitor 7 and a resistance 8, and a component of the signal is converted into a direct-current voltage (hereinafter referred to as DC voltage). The DC voltage is then applied to a comparator portion 4. Comparator portion 4 compares respective values of the DC voltage from detection portion 3 with an arbitrary DC voltage supplied from a reference voltage generating portion 5. If the DC voltage from detection portion 3 is lower than the DC voltage from reference voltage generating portion 5, comparator portion 4 controls the level of the high-frequency signal output from transmission-level adjusting portion 1 to be high, and to be low if otherwise.

Transmission-level adjusting portion 1 is realized by a circuit such as a variable gain amplifier and a variable attenuator. The high-frequency signal output from transmission-level adjusting portion 1 is distributed again by distribution portion 2 and applied to detection portion 3. By repeating this operation, the value of the DC voltage output from detection portion 3 eventually converges at the same value as that of the DC voltage from reference voltage generating portion 5.

The circuit configuration described above allows the output transmission power to be fixed to constant power corresponding to the reference voltage of reference voltage generating portion 5, even if the power of the input high-frequency signal is varied in the transmission power control circuit. This enables stable transmission power to be supplied.

However, the conventional transmission power control circuit has a problem in that, when a signal having a frequency band is input, an output high-frequency signal may have an inclination in the frequency property due to the property of the detection efficiency of detection portion 3. Even if the frequency property of the high-frequency signal input into detection portion 3 is flat, the DC voltage output from detection portion 3 may be inclined as shown in FIG. 10A, since the detection efficiency of detection portion 3 has a property such that the efficiency becomes smaller as the frequency becomes higher. Thus, comparator portion 4 recognizes that the power of a high frequency is smaller. As a result, the power of the high-frequency output of transmission-level adjusting portion 1 has an inclined frequency property such that the power is smaller in lower frequency and larger in higher frequency.

It is noted that the detection efficiency of detection portion 3 is different in accordance with a frequency property of a diode, and thus an opposite inclination may be possible depending on the diode used.

SUMMARY OF THE INVENTION

Therefore, a principal object of the present invention is to provide a transmission power control circuit that can cancel a frequency property of a detection unit and maintain high-frequency power constant irrespective of frequency.

According to an aspect of the present invention, a transmission power control circuit includes a transmission-level adjusting portion adjusting a level of an input high-frequency signal; a distribution portion distributing and taking out a part of the high-frequency signal output from the transmission-level adjusting portion; a detection portion detecting the high-frequency signal taken out by the distribution portion; a comparing portion comparing a DC voltage obtained by the detection portion with a reference voltage, and controlling a gain of the transmission-level adjusting portion in accordance with an output of the comparison; and a frequency-deviation adjusting portion arranged between the distribution portion and the detection portion, canceling a frequency property of the detection portion and making a high-frequency transmission power constant irrespective of frequency.

This allows the frequency property of the detection portion to be canceled and the high-frequency transmission power to be constant irrespective of the frequency.

Preferably, the transmission power control circuit further includes an amplifying portion connected between the frequency-deviation adjusting portion and the detection portion.

More preferably, the frequency-deviation adjusting portion includes a capacitor connected in series between the distribution portion and the detection portion.

More preferably, the frequency-deviation adjusting portion includes an inductor connected in series between the distribution portion and the detection portion.

More preferably, the frequency-deviation adjusting portion includes a microstrip filter connected in series between the distribution portion and the detection portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
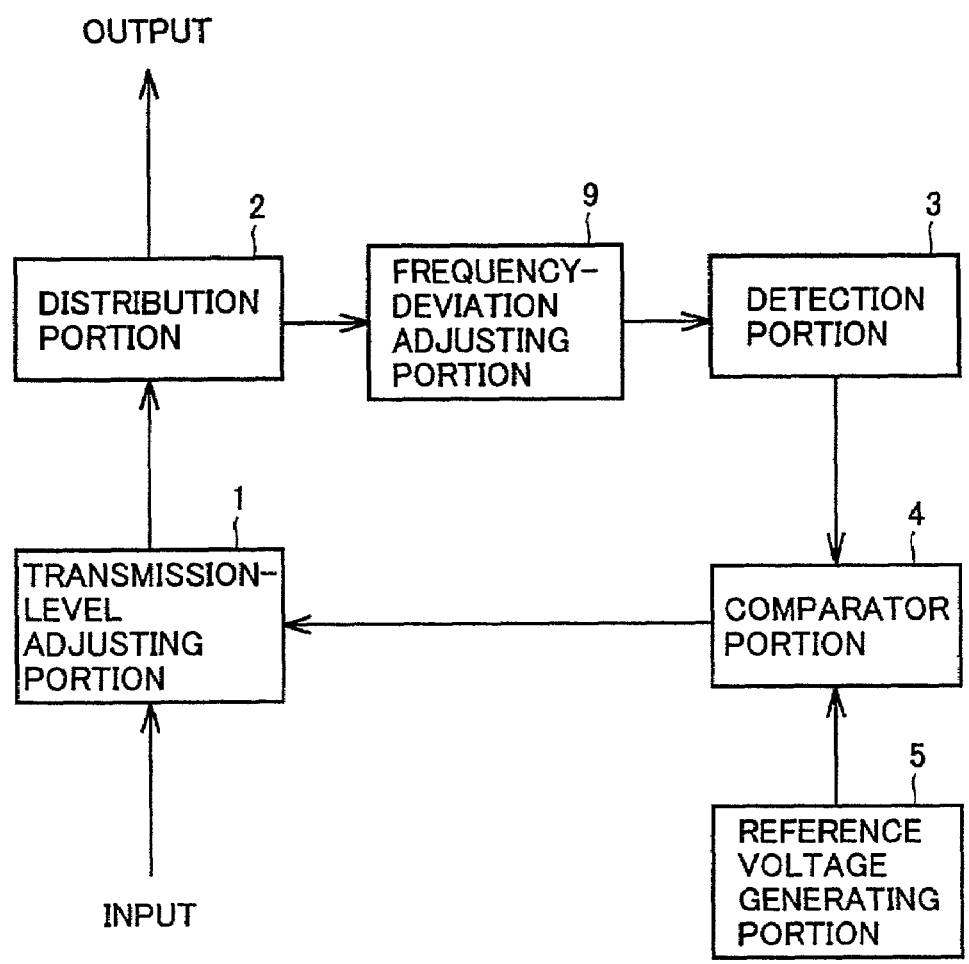
FIG. 1 is a block diagram of a transmission power control circuit according to the first embodiment of the present invention.

FIG. 1 is a block diagram of a transmission power control circuit according to the first embodiment of the present invention, and FIGS. 2A to 2D show properties of the embodiment shown in FIG. 1.

Referring to FIG. 1, a high-frequency signal is input into a transmission-level adjusting portion 1, where the signal is adjusted in its level, and is further input into a distribution portion 2. Distribution portion 2 creates two signals from the input high-frequency signal, one of which is output as a transmission signal and the other one of which is applied to a frequency-deviation adjusting portion 9, characterizing the present invention. Frequency-deviation adjusting portion 9 has a frequency property of an inclination in attenuation opposite to that of detection portion 3, as shown in FIGS. 2A and 2B, and applies its output signal to detection portion 3.

At detection portion 3, the input high-frequency signal is detected and rectified so as to be converted into a DC voltage. The DC voltage is applied to a comparator portion 4. Comparator portion 4 compares the respective values of an arbitrary DC voltage supplied from a reference voltage generating portion 5 and the DC voltage from detection portion 3. If the DC voltage from detection portion 3 is lower than the DC voltage from the reference voltage generating portion 5, comparator portion 4 controls the level of the high-frequency signal output from transmission adjusting portion 1 to be high, and to be low if otherwise.

Transmission-level adjusting portion 1 is realized by a variable gain amplifier or a variable attenuator. The high-frequency signal output from transmission-level adjusting portion 1 is distributed again by distribution portion 2, and applied to detection portion 3. By repeating this operation, the value of the output DC voltage eventually converges at the same value as that of the DC voltage of reference voltage generating portion 5.

Figure 2A:
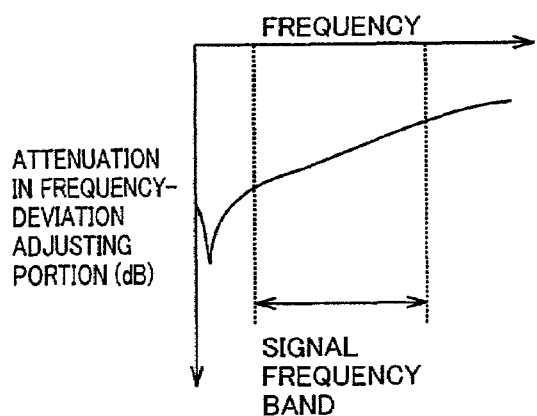
FIGS. 2A to 2D show properties of the embodiment shown in FIG. 1.
Figure 2B:
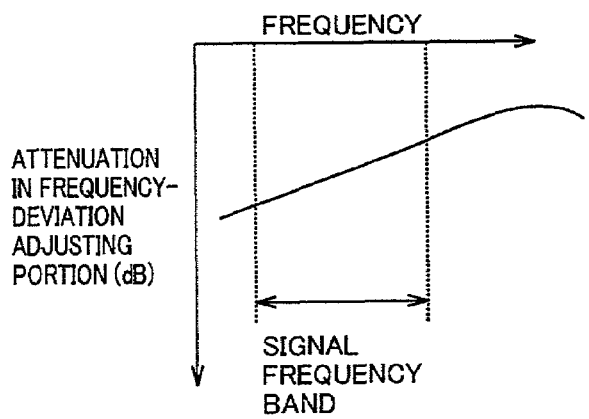
Figure 2C:
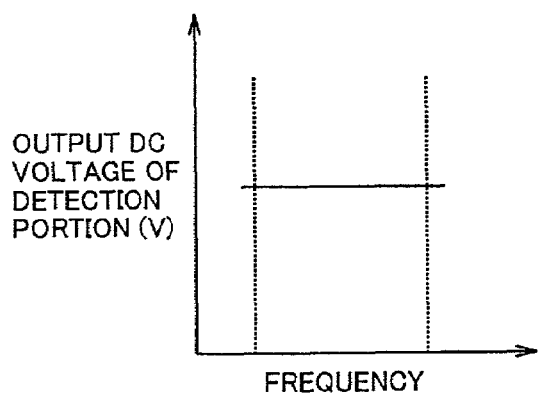

In this embodiment, frequency-deviation adjusting portion 9 has, as shown in FIG. 2A or 2B, a property such that attenuation decreases as the frequency increases. Thus, the frequency property of detection portion 3 is cancelled out by the frequency property of frequency-deviation adjusting portion 9, allowing the output voltage of detection portion 3 to attain a flat property having no inclination, as shown in FIG. 2C. The DC voltage output from detection portion 3 is applied to comparator portion 4.

Figure 2D:
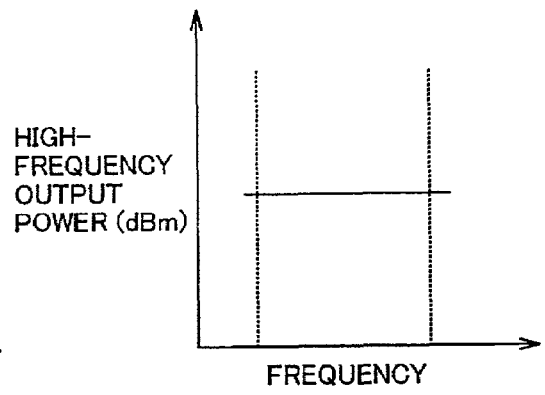

At comparator portion 4, a process similar to that in the conventional example is performed, and the transmission power is fixed to a constant power according to the reference voltage of reference voltage generating portion 5. Here, the property of the output DC voltage of the detection portion 3 is flat, which makes the output of transmission-level adjusting portion 1 also flat, and therefore the transmission power can eventually attain a property with no inclination, as shown in FIG. 2D.

It is noted that the transmission power control circuit in FIG. 1 shows only a part of the transmitter, and the output thereof is, though not shown, transmitted via connection to an antenna, or is connected to a mixer where it is frequency-converted for subsequent transmission.

Figure 3:
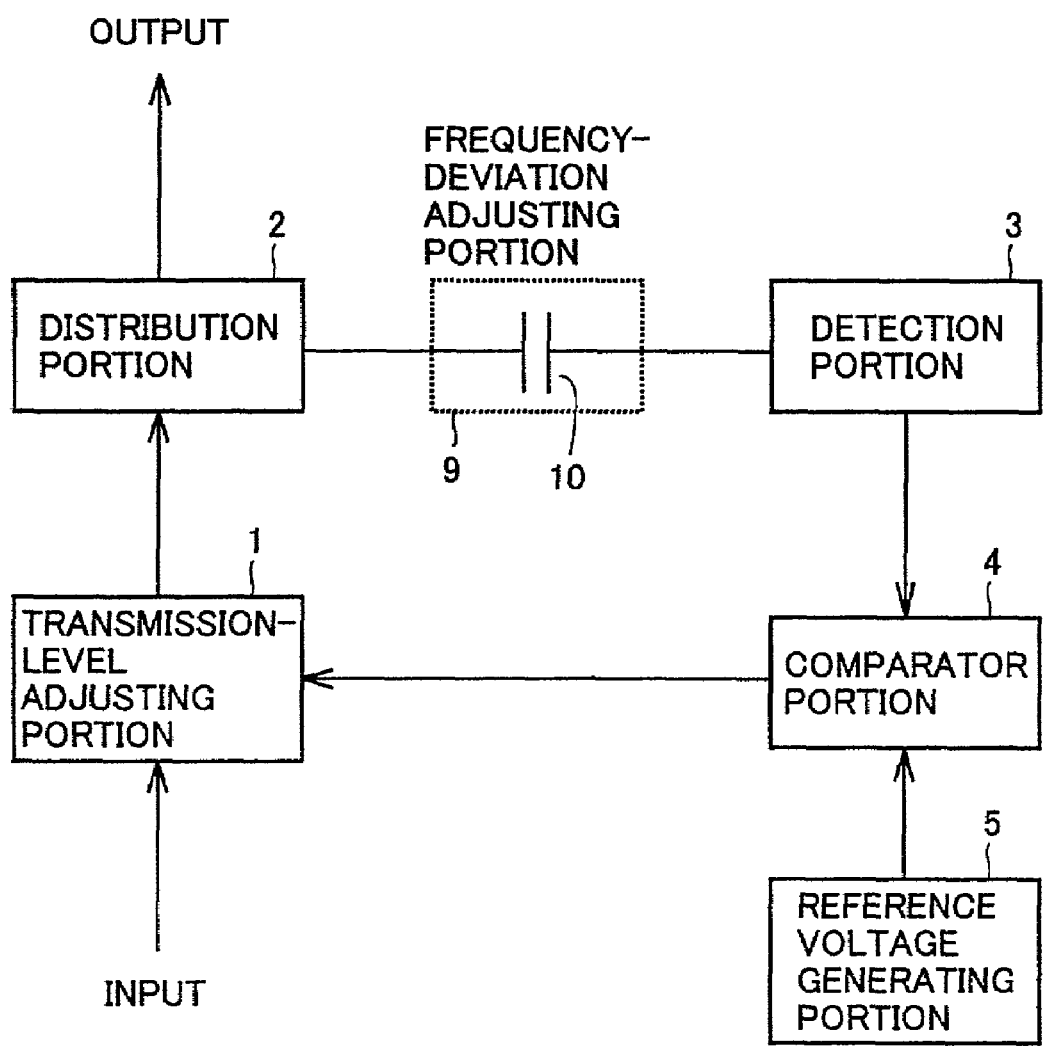
FIG. 3 is a block diagram showing a transmission power control circuit according to the second embodiment of the present invention.

FIG. 3 is a block diagram showing a transmission power control circuit according to the second embodiment of the present invention. This embodiment shows a more specific circuit configuration for frequency-deviation adjusting portion 9, in which a capacitor 10 is connected in series. When a signal passes through the serial capacitor 10, an impedance indicated by $1/\omega C$ ($\omega$: frequency, C: capacitance) is generated for a signal having a frequency equal to or lower than a self resonant frequency of capacitor 10. As indicated by the expression above, the impedance is lowered as the frequency is increased, and if the frequency is approximately the same as a bandwidth used for transmission (equal to or lower than 500 MHz), the property within the band is approximated to be linear, resulting in a property as shown in FIG. 2A.

It is noted that capacitance C is changed depending on the frequency of a signal or the inclination in the frequency property of detection portion 3. C is set to be larger when the signal frequency is low, whereas C is set to be smaller when the signal frequency is high. Moreover, C is set to be larger when the inclination is small, whereas C is set to be smaller when the inclination is large.

Figure 4:
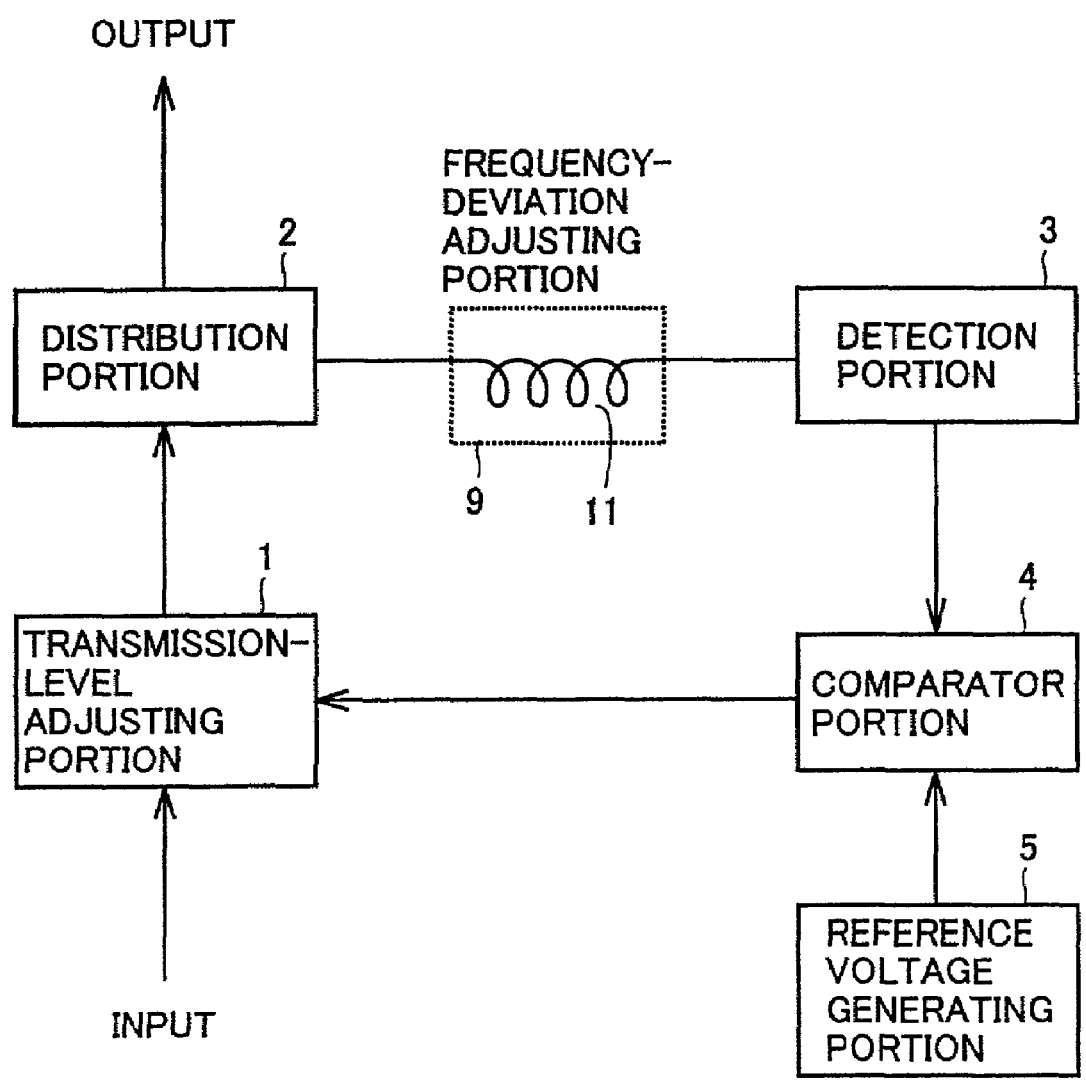
FIG. 4 is a block diagram showing a transmission power control circuit according to the third embodiment of the present invention.

FIG. 4 is a block diagram showing a transmission power control circuit according to the third embodiment of the present invention.

This embodiment is to use an inductor 11 in place of capacitor 10 in FIG. 3, as frequency-deviation adjusting portion 9. When a signal passes through the serial inductor 11, an impedance indicated by $\omega L$ ($\omega$: frequency, L: inductor) is generated for a signal having a frequency equal to or lower than a self resonance frequency of inductor 11. As indicated by the expression above, the impedance increases as the frequency is increased. Since the inclination is opposite to the case with the capacitor, this is effective when the frequency property is inclined such that the output DC current of detection portion 3 decreases as the frequency is lowered.

Figure 5:
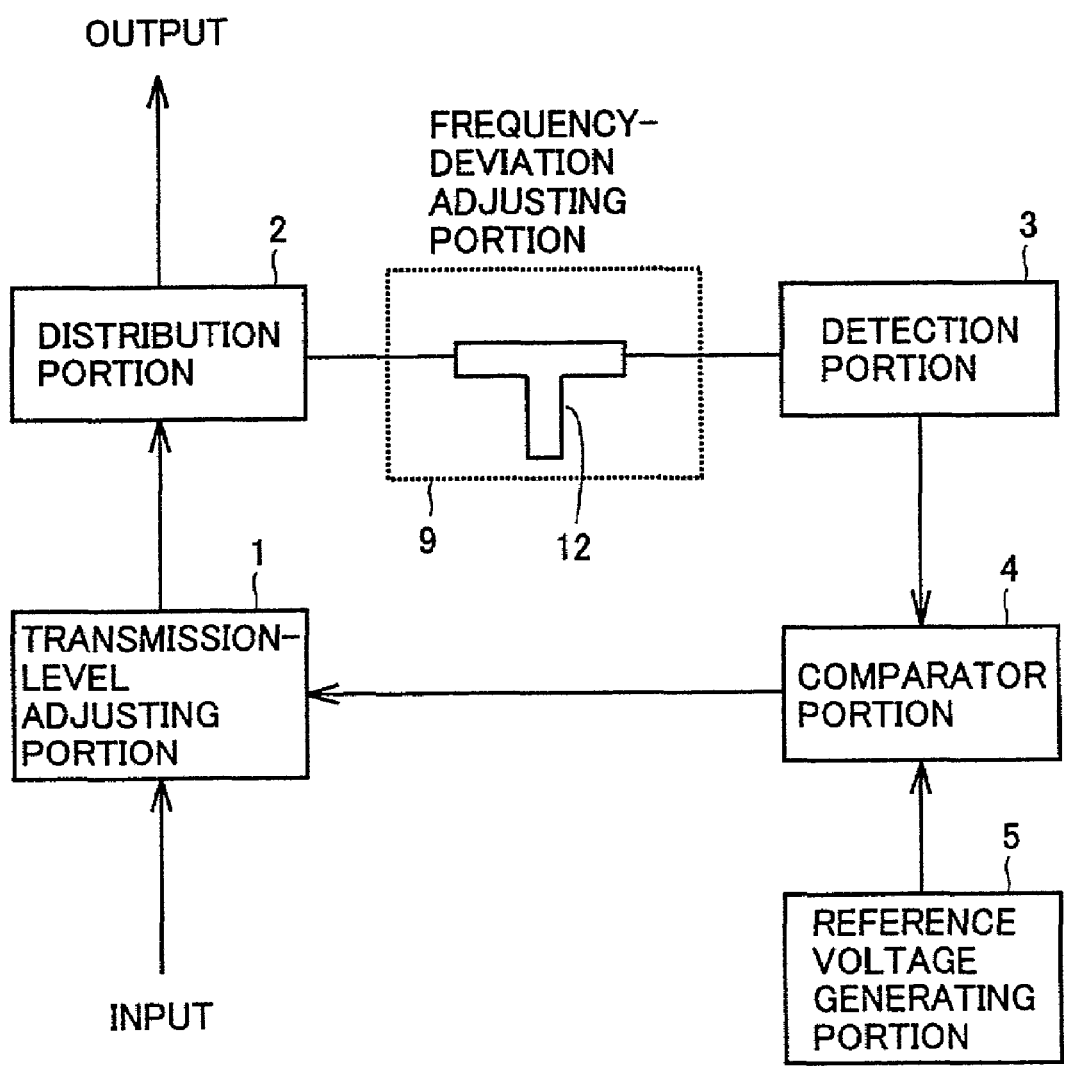
FIG. 5 is a block diagram showing a transmission power control circuit according to the fourth embodiment of the present invention.

FIG. 5 is a block diagram showing a transmission power control circuit according to the fourth embodiment of the present invention.

This embodiment is to use a microstrip filter 12 in place of inductor 11 shown in FIG. 4. When the frequency to be detected is a microwave, the frequency would largely exceed the self resonance frequencies of capacitor 10 and inductor 11 shown in FIGS. 3 and 4 respectively, so that no frequency with desirable inclination can be attained. Hence, microstrip filter 12 is arranged to attain the frequency with desirable inclination. Although numerous shapes can be considered for microstrip filter 12, a T-shaped pattern is used as an example to constitute a frequency trap as illustrated by microstrip filter in FIG. 5, to attain the property as shown in FIG. 2A. In order to cancel the inclination of detection portion 3 by such microstrip filter 12, a high-frequency simulator is used at the designing stage of a substrate to accurately create a pattern in consideration of the dielectric constant and signal bandwidth.

Figure 6:
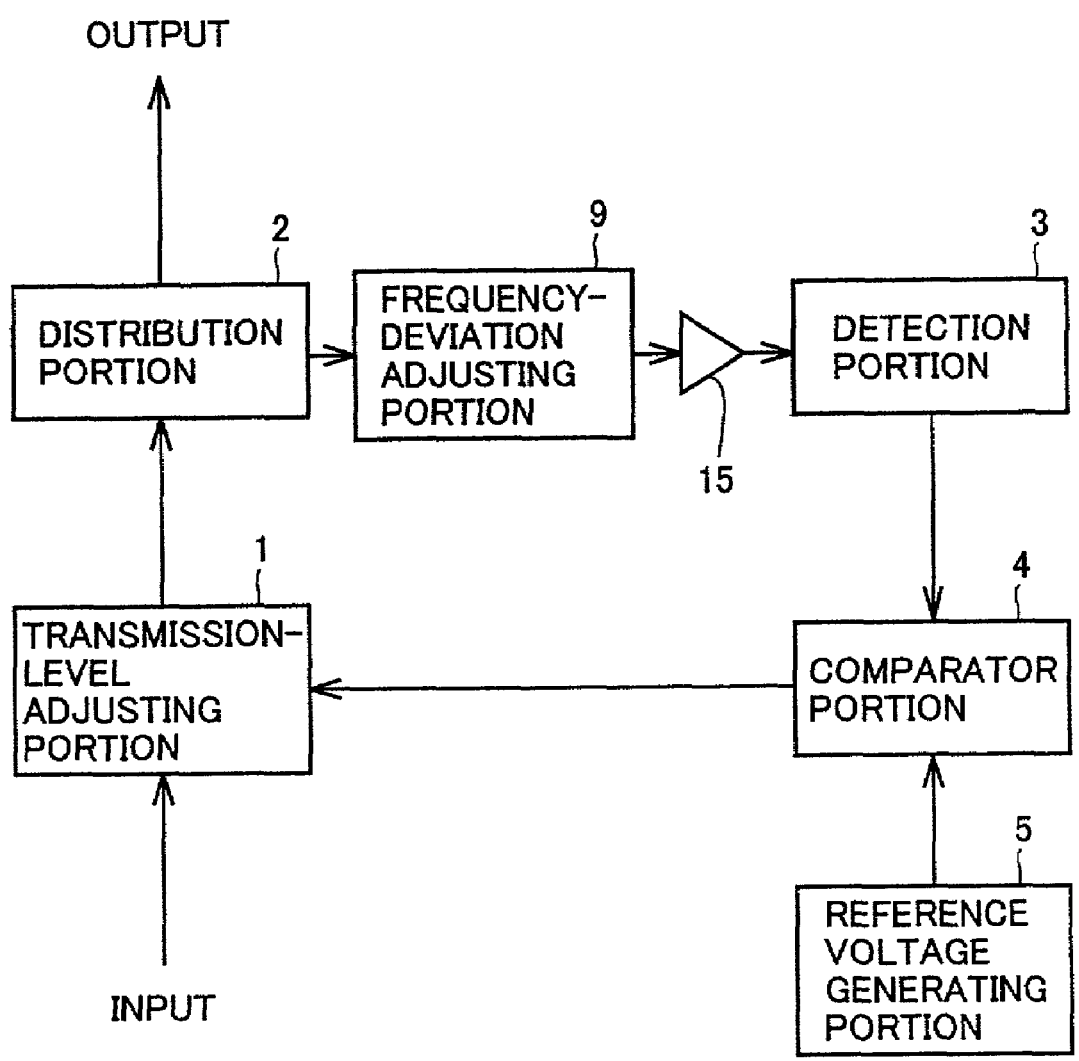
FIG. 6 is a block diagram showing a transmission power control circuit according to the fifth embodiment of the present invention.

FIG. 6 is a block diagram showing the transmission power control circuit according to the fifth embodiment of the present invention.

This embodiment further includes, in addition to the configuration of the embodiment in FIG. 1, an amplifier 15 arranged between frequency-deviation adjusting portion 9 and detection portion 3. By thus arranging amplifier 15 between frequency-deviation adjusting portion 9 and detection portion 3, isolation can be secured between frequency-deviation adjusting portion 9 and detection portion 3, allowing frequency-deviation adjusting portion 9 to attain a required property.

Moreover, with amplifier 15 interposed, the level of a signal from distribution portion 2 is amplified. Detection portion 3 depends on a detection efficiency of a diode constituting the same, and may not output a DC voltage when the level of an input signal is low, which can be avoided by amplifier 15. It is noted that a buffer amplifier having an amplification factor of 1 may be used as amplifier 15 if isolation is the only requirement.

Figure 7:
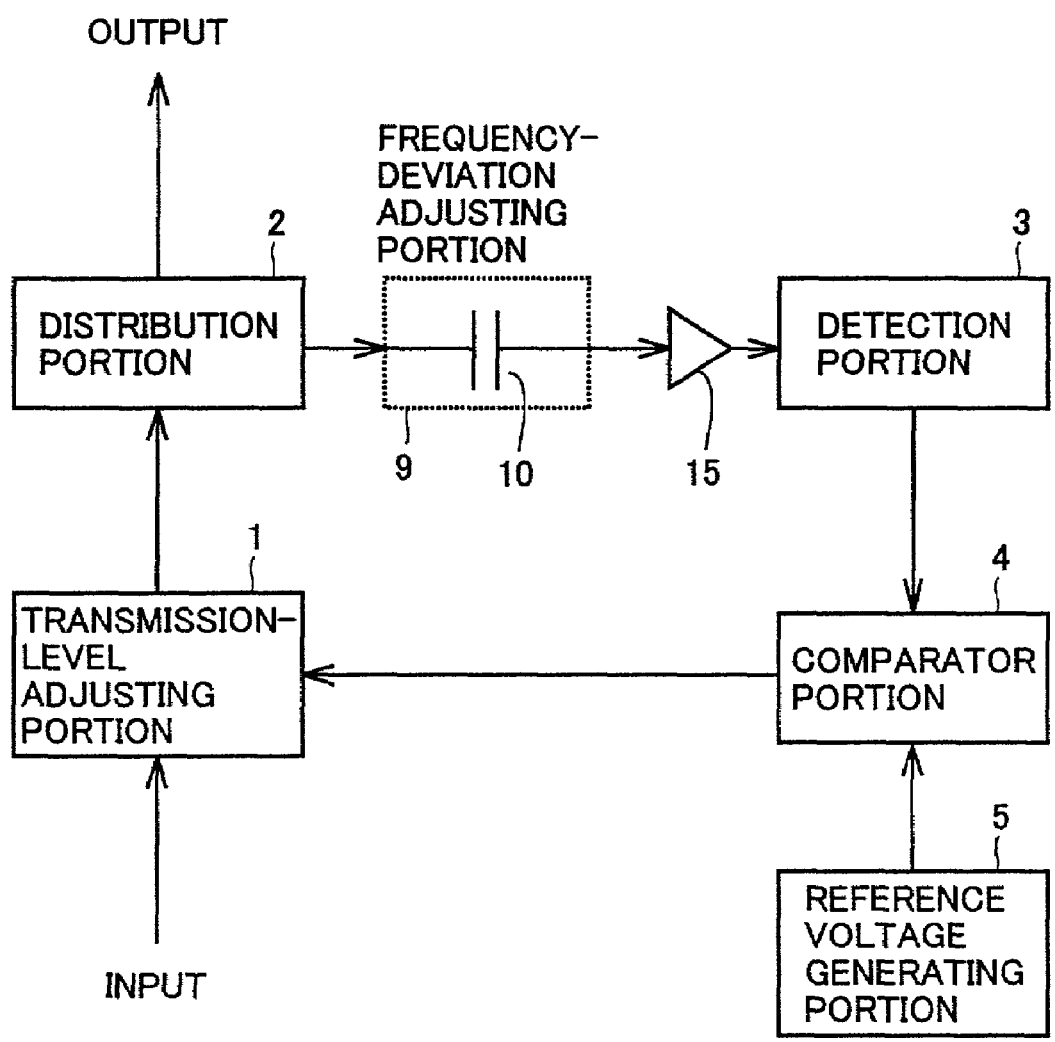
FIG. 7 is a block diagram showing a transmission power control circuit according to the sixth embodiment of the present invention.
Figure 8:
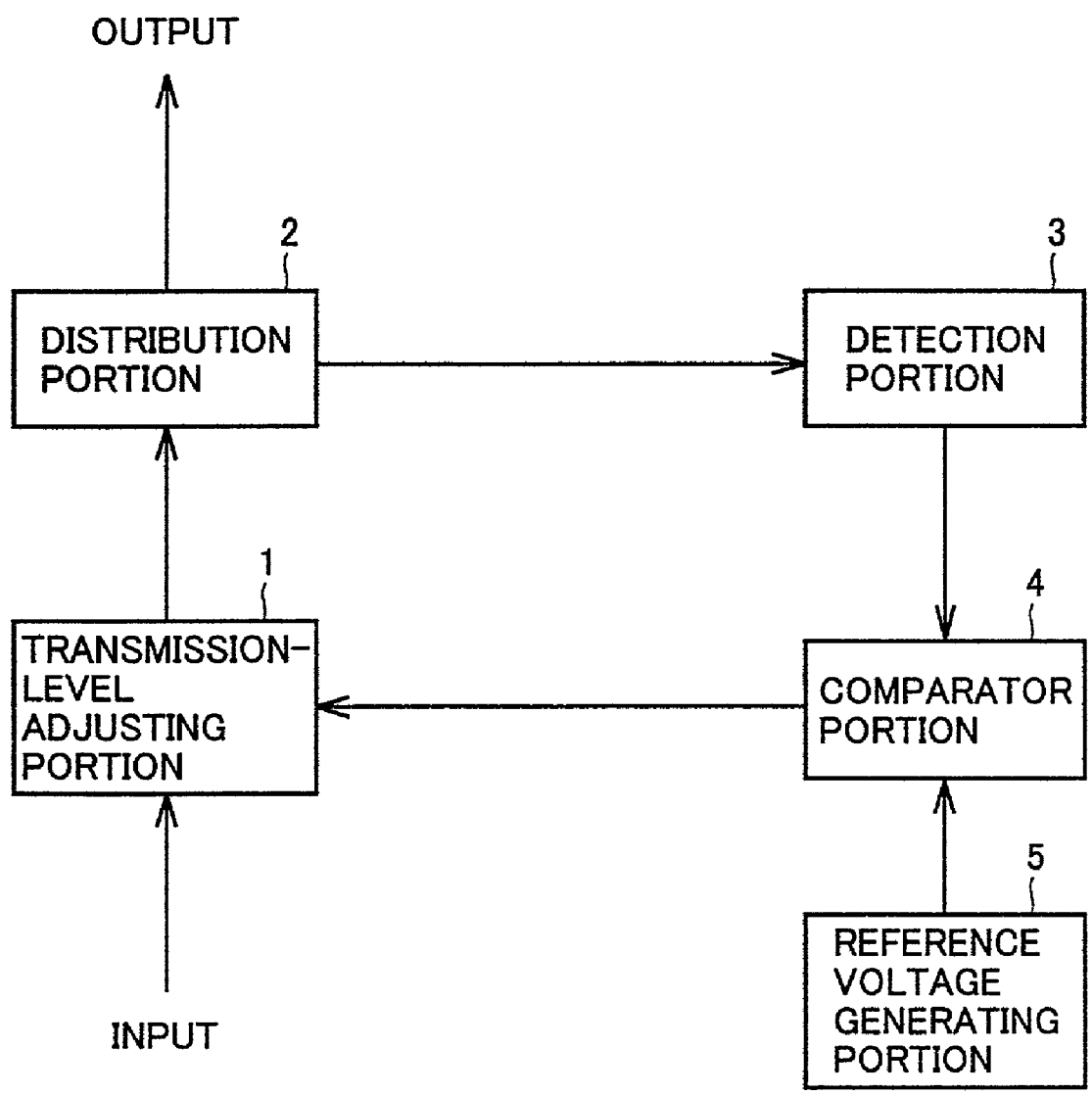
FIG. 8 is a block diagram showing an example of the conventional transmission power control circuit.
Figure 9:
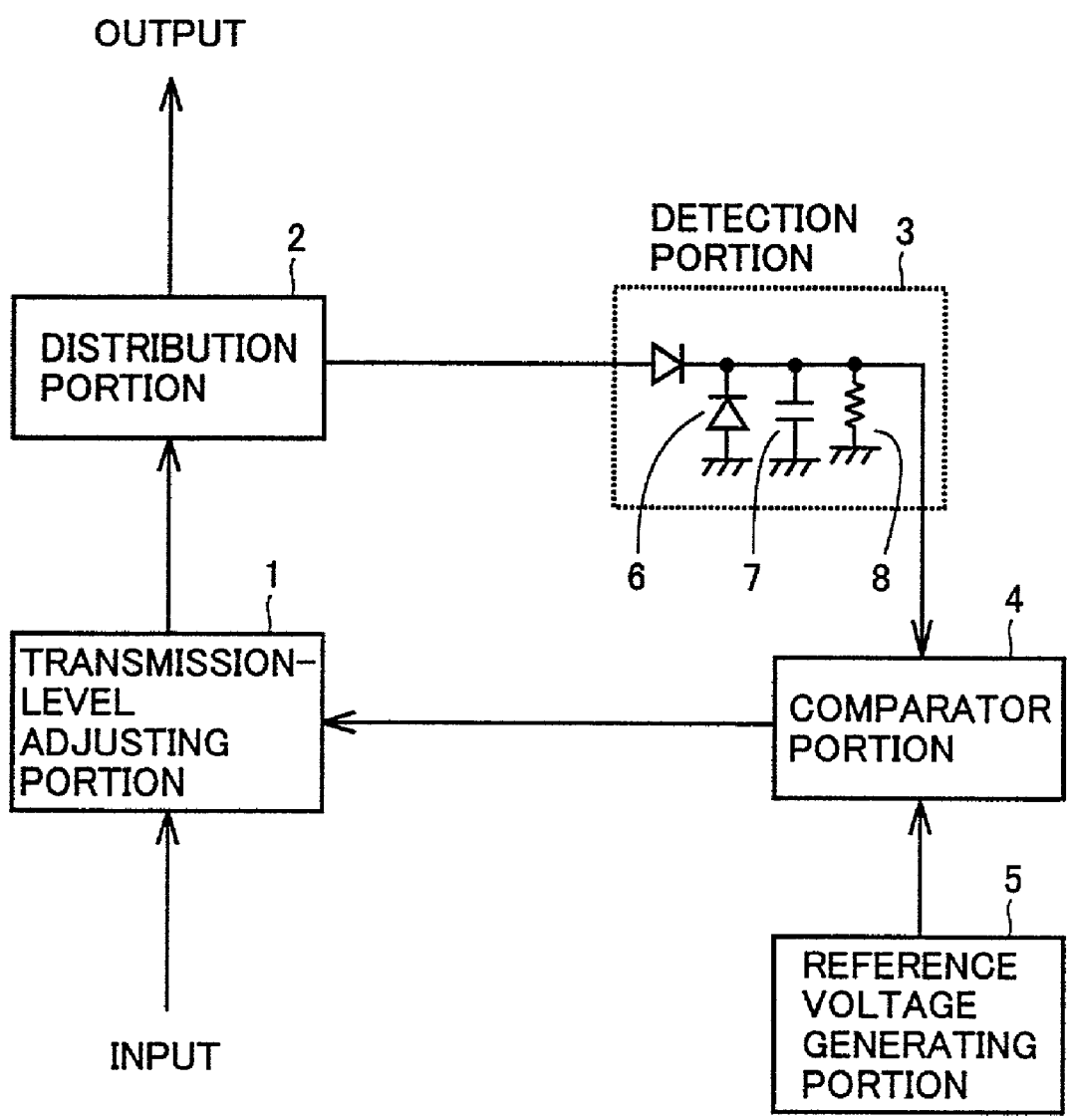
FIG. 9 is a block diagram showing the details of the detection portion of the conventional transmission power control circuit shown in FIG. 8.
Figure 10A:
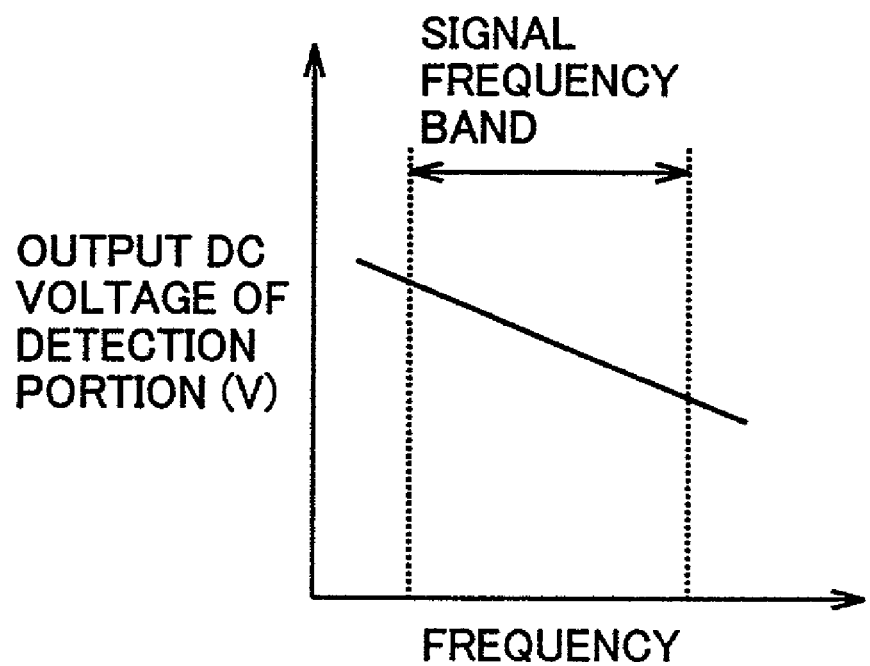
FIGS. 10A and 10B show properties of the conventional transmission power control circuit.
Figure 10B:
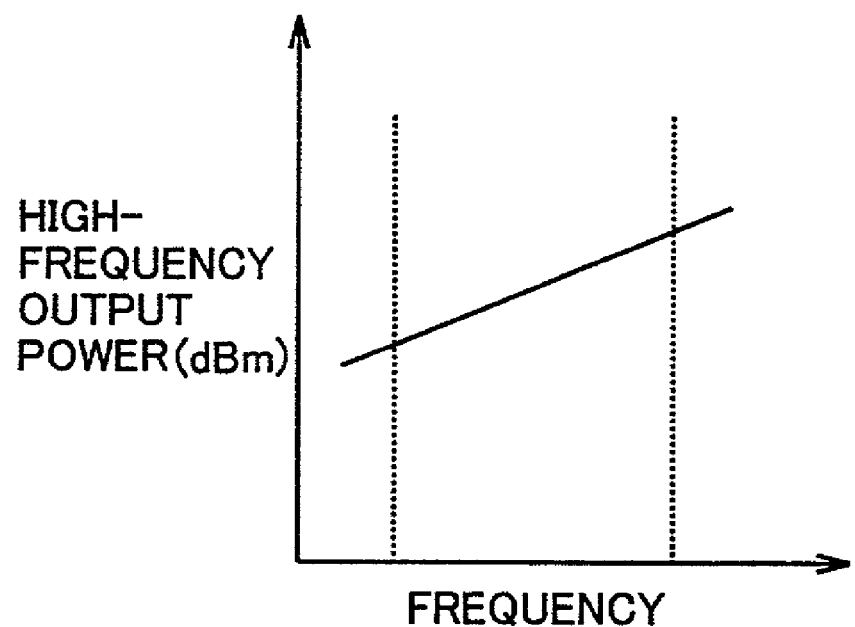

FIG. 7 is a block diagram showing a transmission power control circuit according to the sixth embodiment of the present invention.

This embodiment is to interpose amplifier 15 between frequency-deviation adjusting portion 9 and detection portion 3 in the embodiment of FIG. 3. As shown in FIG. 3, when detection portion 3 and capacitor 10 are connected in series, an impedance property with the inclination required by the interposed capacitor 10 may not be attained due to a stray capacitance of the diode constituting detection portion 3 or an effect of impedance.

Hence, amplifier 15 is interposed in the embodiment shown in FIG. 7 to secure isolation between detection portion 3 and capacitor 10, while capacitor 10 can attain a required property.

It is noted that, though capacitor 10 is used as frequency-deviation adjusting portion 9 in FIG. 7, it is not limited to capacitor 10, and an inductance or a microstrip that can adjust deviation may also be used.

As described above, according to the embodiments of the present invention, frequency-deviation adjusting portion 9 canceling the frequency property of detection portion 3 is provided between distribution portion 2 distributing a part of the power output from transmission-level adjusting portion 1 and detection portion 3 detecting a high-frequency signal, so that high-frequency power can be made constant irrespective of frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A transmission power control circuit, comprising:
   a transmission-level adjusting portion adjusting a level of an input high-frequency signal;
   a distribution portion distributing and taking out a part of a high-frequency signal output from said transmission-level adjusting portion;
   a detection portion detecting the high-frequency signal taken out by said distribution portion;
   a comparing portion comparing a DC voltage obtained by said detection portion with a reference voltage, and controlling a gain of said transmission-level adjusting portion in accordance with an output of the comparison; and
   a frequency-deviation adjusting portion arranged between said distribution portion and said detection portion, canceling a frequency property of said detection portion, and making a high-frequency transmission power constant irrespective of frequency.

2. The transmission power control circuit according to claim 1, further comprising: an amplifying portion connected between said frequency-deviation adjusting portion and said detection portion.

3. The transmission power control circuit according to claim 1, wherein said frequency-deviation adjusting portion includes a capacitor connected in series between said distribution portion and said detection portion.

4. The transmission power control circuit according to claim 1, wherein said frequency-deviation adjusting portion includes an inductor connected in series between said distribution portion and said detection portion.

5. The transmission power control circuit according to claim 1, wherein said frequency-deviation adjusting portion includes a microstrip filter connected in series between said distribution portion and said detection portion.

6. The transmission power control circuit according to claim 1, wherein the frequency-deviation adjusting portion has a frequency property of an inclination in attenuation opposite to that of the detecting portion.

* * * * *